July 7, 1970 D. T. KELLEY 3,519,896

POWER TRANSISTOR ASSEMBLY

Filed March 11, 1969

INVENTOR.
Dale T. Kelley

BY
Mueller, Aichele & Rauner

ATTY'S.

United States Patent Office 3,519,896

Patented July 7, 1970

3,519,896
POWER TRANSISTOR ASSEMBLY

Dale T. Kelley, Phoenix, Ariz., assignor to Motorola, Inc., Franklin Park, Ill., a corporation of Illinois Filed Mar. 11, 1969, Ser. No. 806,255
Int. Cl. H01l 1/14
U.S. Cl. 317—234 6 Claims

ABSTRACT OF THE DISCLOSURE

A semiconductor package assembly wherein a conductive lead clip is mounted on a header and makes electrical contact with metallic spheres or balls on the surface of a semiconductor die supported by the header. The lead clip has one or more elongated openings therein for engaging, respectively, one or more metallic spheres on the semiconductor die. Feed-throughs which support the lead clip provide external electrical connection to the die which is enclosed within the completed package assembly.

BACKGROUND OF THE INVENTION

This invention relates generally to semiconductor package assemblies and more particularly to a TO type package assembly for power transistors.

There are various types of so-called "TO" (transistor outline) transistor package assemblies in the prior art which are used for supporting a semiconductor die and providing electrical contact to the active regions of the semiconductor die. One such type of prior art package assembly uses small wires which are bonded between a semiconductor die on a header and posts or "feed-throughs" which extend through the header. The feed-throughs extend from one side of the header where they are individually bonded to the small wires through openings in the header to the "outside world." The ends of the feed-throughs which extend outside the semiconductor package are thus available for connection to various types of electronic circuitry.

In order to eliminate the steps of bonding the wires to both the semiconductor die and to the posts or feed-throughs of the semiconductor assembly, it has recently been proposed to bond metallic spherical electrodes to active regions of the semiconductor die and to use a lead clip to make electrical connections to these electrodes. The elimination of the small wires is especially desirable for certain types of power transistors and other power devices having a current rating in excess of the current handling capability of the small wires. The elimination of the separate steps of wire bonding to both the die and feed-throughs is often desirable from a production cost standpoint.

When the metallic spheres are used for the electrodes in power transistor assemblies, it has been one practice to use a conductive metal lead clip which can be mounted on the feed-throughs and which has arm portions thereof extending over the semiconductor die and into electrical contact with the spheres. One type of semiconductor assembly of this type is disclosed and claimed in copending patent application Ser. No. 695,015 of Dale T. Kelley, filed Jan. 2, 1968, and assigned to the present assignee. In this application, receptacles or "nests" as they are sometimes called are formed on the surface of the header and are adapted to receive the individual semiconductor dice for maintaining the dice in a desired location with respect to the lead clip. These receptacles or nests are slightly larger than the die which is inserted therein, so that an assembly line operator may rapidly place the die within the nests using a small tool such as a vacuum pencil. Thus, the receptacles provide a relatively low loading tolerance when placing the semiconductor die onto the headers.

While the semiconductor assembly and process described in the copending Kelley application Ser. No. 695,015 have been quite satisfactory for the packaging of a majority of the presently commercial power transistors, there are certain types of semiconductor devices including power transistors which are not suited for this type of assembly. Among these are transistors wherein one or more PN junctions extend to the side of the semiconductor die rather than to the top surface thereof. For this type of semiconductor die, it is possible for a PN junction to become shorted against the side of the receptacle or nest under certain environmental conditions and for certain types of PN junction surface protection. For this type of semiconductor die which has at least one PN junction extending to the side thereof, it is sometimes desirable to mount the die on a flat continuous surface of the header, eliminate the receptacles on the header, and yet still maintain a relatively low die loading tolerance such as low loading tolerance made possible by the invention disclosed and claimed in the above Kelley application Ser. No. 695,015. By lowering the die loading tolerances which are available to an assembly line operator, higher assembly speeds can be achieved and thus production costs can be lowered.

OBJECTS AND FEATURES OF THE INVENTION

An object of the present invention is to provide a new and improved transistor package assembly wherein the sides of the semiconductor dice assembled are free from electrical shorting by adjacent metals.

Another object of this invention is to provide a new and improved semiconductor package which requires relatively low die positioning tolerances in the assembly thereof.

Another object of this invention is to provide a power transistor assembly having a relatively high current handling capability.

A feature of this invention is the provision of a new and improved semiconductor package assembly in which the semiconductor die is mounted on a continuous smooth surface of the header.

Another feature of this invention is the provision of a new and improved lead clip having a novel geometry which is especially suited for use with semiconductor dice having metallic spherical electrodes thereon. The lead clip has a pair of arms which extend over a semiconductor die mounted on a header. The arms of the lead clip have elongated openings therein which engage spherical electrodes on the surface of the semiconductor die. Relatively low loading tolerances are required to position the die on the header at a location where the elongated openings of the lead clip arms can be brought into electrical contact with the spherical electrodes.

BRIEF DESCRIPTION OF THE DRAWINGS

In FIG. 4 the lead clip has been cut into two pieces to prevent shorting between spheres on the semiconductor die.

THE INVENTION

Figures 1, 2, 3A, 3B, 4:
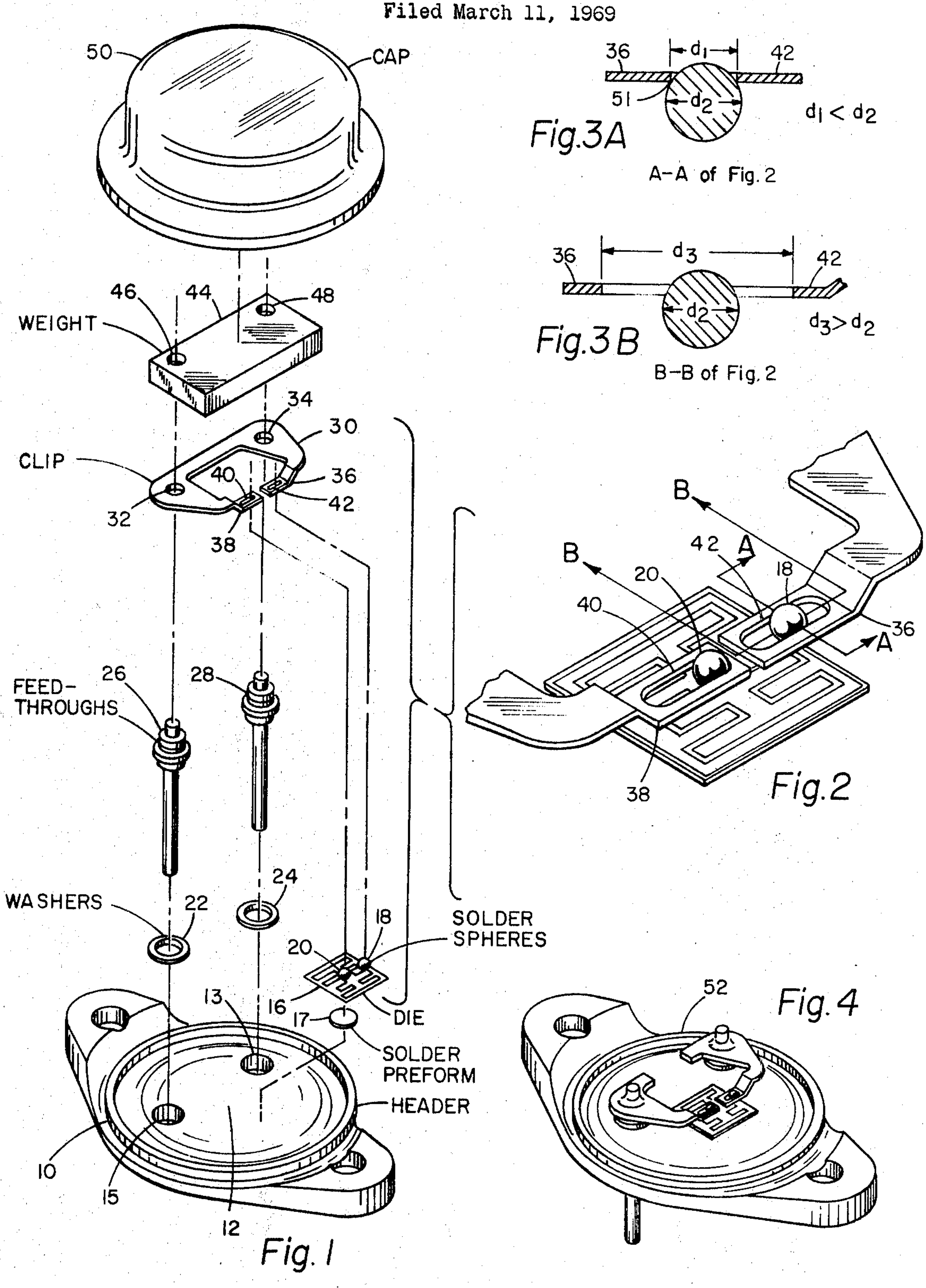
FIG. 1 is an exploded view of the semiconductor package assembly according to the present invention.
FIG. 2 is an enlarged view of the semiconductor die and lead clip arm portion of the exploded view in FIG. 1.
FIGS. 3A and 3B are cross section views respectively taken along lines A—A and B—B in FIG. 2.
FIG. 4 is a perspective view of the partially assembled package of the invention.

Briefly described, the present invention includes a header adapted to receive and support a semiconductor die having raised metallic contacts thereon. These contacts may, for example, be spherical electrodes which make electrical connections to active regions of the die. A novel lead clip is mounted on the header in a preselected fixed location with respect to the die so that a pair of arms of the lead clip extend over and into contact with the metallic contacts on the die. The arms have spaced elongated openings therein which are dimensioned with respect to the maximum corresponding dimensions of the metallic contacts so that the arms initially engage the metallic contacts in the elongated openings at relatively low tolerances. Thereafter, the lead clip retains the die at a fixed location on the header during the life of the completed assembly.

Referring to the drawings in detail, there is shown in the exploded view of FIG. 1 header means 10 having a top surface thereof 12 on which a semiconductor die 16 is to be mounted. The header 10 has a pair of openings 13 and 15 therein to facilitate making electrical connections from the top surface of the die to the bottom surface thereof as shown in FIG. 1.

A pair of metallic contacts 18 and 20 which have been previously soldered or otherwise permanently bonded to the top surface of the die 16 make electrical contact to the active regions of the die 16. In the embodiment of the invention illustrated in the drawing, the contacts 18 and 20 are metallic spheres or spherical electrodes which may, for example, provide electrical contact for the base and emitter regions of a power transistor. However, these metallic spheres may make electrical contact to other active and passive elements of a semiconductor device or integrated circuit within the die 16, and the present invention is not limited to contacting the base and emitter regions of a power transistor. A solder preform 17 is used to bond the die 16 to the surface 12 of the header 10 during a final heating treatment of the assembly.

A pair of washers 22 and 24 are used to receive a pair of metal posts or feed-throughs 26 and 28 which extend through the openings 15 and 13 to the reverse side of the header 10 once the package has been assembled. The feed-throughs 26 and 28 are electrically connected to a clip means 30, and the top portions of the feed-throughs 26 and 28 extend through the openings 32 and 34 in the clip 30 and support the clip 30 in a fixed position on the header 10.

The clip 30 is a unitary member as shown in FIG. 1 and has a pair of arms 36 and 38 thereon which extend downwardly and inwardly toward the center of the header 10. Each arm 36 and 38 has an elongated opening 42 and 40 respectively therein for receiving the metallic contacts 18 and 20. A weight 44 is temporarily positioned to rest on the top of the clip 30 and is supported by the ends of the feed-throughs 26 and 28 which extend into the openings 46 and 48 of the weight 44. A cap 50 is used to cover the package assembly shown in FIG. 1 when the remaining piece parts of the package assembly are assembled.

The enlarged view of FIG. 2 illustrates how the arms 36 and 38 of the clip 30 extend downwardly and inwardly to engage the contacts 18 and 20 in the elongated openings 42 and 40, respectively. For the semiconductor die 16 shown, the metallic contact 20 is soldered to one of the transistor regions at a location near the center of the die 16 and the metallic contact 18 is soldered to an area near one side of the die 16. As seen in FIG. 2, the initial position of the die 16 on the surface 12 of the header 10 is not restricted to one specific area. The die 16 may be initially positioned at different locations along the major axis of the elongated openings 40 and 42 of the arms 36 and 38 and still be in a position where the openings 40 and 42 will physically engage the spheres 20 and 18 once the clip 30 is mounted on the feed-throughs 28 and 26. Such freedom of die movement when the die is initially positioned on the header 10 provides an assembly line operator with a relatively low loading tolerance, i.e., the die is not required to be placed in one specific location on the header in order to make electrical contact with the lead clip 30.

The amount of tolerance provided along the major axis of the openings 40 and 42 may be easily varied by those skilled in the art. For this reason, the present invention is not limited to any specific dimensions of the contacts 18 and 20, the elongated openings 40 and 42, the spacing between arms 36 and 38, and the spacing between the contacts 18 and 20. The width of the elongated openings 40 and 42 should not be greater than the maximum dimension, i.e., diameter, of the spheres 18 and 20. Typically, the elongated openings 40 and 42 engage these spheres 20 and 18 at some point above the equator of the sphere. The length of the major axis of the elongated openings 18 and 20 is, of course, greater than the maximum corresponding dimension or diameter of the sphere; this length may be varied in accordance with the desired tolerance for a particular semiconductor package assembly.

The cross sections views in FIGS. 3A and 3B illustrate the approximate relative dimensions of the sphere 18 and the elongated opening 42. Conveniently, the arm 36 contacts the sphere at point 51 on the sphere and has a width $d_1$ less than the diameter $d_2$ of the sphere, i.e., $d_1<d_2$. The length $d_3$ of the elongated opening 42 and thus the length of the major axis of opening 42 is greater than the diameter of the sphere 18, i.e., $d_3>d_2$.

FIG. 4 illustrates an assembled semiconductor package without the weight 44 and cap 50. As seen in FIG. 3, the clip 30 has been severed so that the arms 36 and 38 are electrically separated and can provide separate electrical connections to the individual contacts 18 and 20. However, prior to severing the lead clip 30, the semiconductor die 16 is bonded to the surface 12 of the header 10 by heating a solder preform 17 which is located between the die 16 and header 10. This soldering is done in a conveying furnace at a temperature typically in the order of 410° C. and using a solder composed of approximately 2.5% silver, approximately 5% indium, and approximately 92.5% lead.

The solder rings or washers 22 and 24 and the preform 17 are typically of this composition, while the solder used to affix the spheres 18 and 20 to the metallization on the die 16 contain approximately 5% silver to reduce the amount of silver metallization dissolved from the die 16.

The weight 44 insures a good solder bond between the header 10 and the die 16, and the weight 44 is removed after the above soldering operation is completed.

The solder spheres 18 and 20 can be bonded to the die 16 by locating smaller spheres (not shown) between the spheres 18 and 20 and the die 16. The smaller solder spheres can be loaded through small passages in a loading assembly (not shown) and allowed to come to rest on top of the die before the larger spheres 18 and 20 are loaded through the same passages. Such a loading operation is disclosed in the above-identified copending Kelley application Ser. No. 695,015. After the spheres 18 and 20 are loaded on top of the die 16, the die and spheres are heated to an elevated temperature to melt the smaller solder spheres and bond the larger spheres to the die 16. In one package assembly of the type described above, the die 16 size was 180 mils square and the solder spheres 18 and 20 were .030 inch in diameter. The smaller solder spheres (not shown) were .013 inch in diameter and comprised of a lead-silver-indium solder composition. The clip 30 was coated with .0015 inch of a lead-silver-indium composition, but in the alternative, a tin-lead-solder composition can be used to coat the clip 30. The elongated openings 40 and 42 in the clip 30 were between .025 and .028 inch wide and were slightly smaller than the .030 inch diameter of the solder spheres 18 and 20.

Various modifications may be made in the above-described embodiment of the invention without departing from the scope thereof. For example, the present invention is not limited to an assembly wherein the metallic contacts are truly spherical in shape. Obviously, other contact shapes could be used, e.g., cones, half-spheres, egg-shaped contacts, and various other geometrical shapes capable of engaging the arms 36 and 38 of the clip 30 at the elongated openings 40 and 42 at relatively low tolerances.

Additionally, openings 40 an 42 could be geometrically modified from their present elongated shape as shown in FIGS. 1 and 2 and still receive the contacts 18 and 20 at relatively low tolerances as previously described.

It is also within the scope of the present invention to use a lead clip which has a single arm thereon with an elongated opening therein for making only one contact to the surface of a semiconductor die. Such a lead clip may be desirable for diode-containing semiconductor dice which only require a single contact on each surface thereof.

Accordingly, it should be understood that the present invention is limited only by way of the following appended claims.

I claim:

1. A semiconductor package assembly including in combination:

(a) a die having at least one raised metallic contact thereon, (b) header means for supporting said die, (c) a clip means having at least one arm with an opening therein adapted to engage and contain said contact, said opening having one dimension smaller than a corresponding dimension of said contact so that said arm can receive and physically engage said contact, and (d) means for mounting said clip means adjacent said die so that said arm of said clip means physically and electrically engages said contact and maintains said die at a fixed location on said header means.

2. The semiconductor package assembly defined in claim 1 wherein the opening of said arm is elongated and has another dimension thereof greater than another corresponding dimension of said contact so that a die loading tolerance is provided in one direction when said arm physically engages said contact, said contact adapted to be received and make electrical connection to said clip means at various locations within said opening.

3. The semiconductor package assembly defined in claim 2 wherein:

(a) said contact is a metallic sphere which is bonded to said die, and (b) said mounting means includes feed-through means mounted on said header means and supporting said clip means at predetermined distance above the surface of said header means.

4. The semiconductor assembly defined in claim 3 wherein said clip means further includes another arm in addition to the first named arm, said arms having openings therein adapted to engage first and second conductive spheres on said die, said openings each having one dimension less than the maximum corresponding dimensions of said spheres and another dimension greater than the maximum corresponding dimension of said spheres; said openings in said arms being spaced relative to each other and relative to the spacing of said first and second spheres on said die so that said die may be moved in the direction of the major axis of the elongated openings in said arms while said first and second spheres maintain continuous electrical contact with said arms, whereby a desirable tolerance is provided in the positioning of said die on said header and beneath said clip means.

5. In a semiconductor package assembly which includes a semiconductor die having one or more spherical electrodes thereon, a header for supporting said semiconductor die, clip means mounted on said header in predetermined spaced relationship to said die and adapted to electrically contact said spherical electrodes; the improvement comprising at least one arm on said clip means having an opening therein for receiving a spherical electrode on said die, said opening having one dimension less than the maximum corresponding dimension of said electrode and one dimension greater than the maximum corresponding dimension of said electrode, so that said arm may be electrically connected to said die when said spherical electrode is positioned at one of several possible locations within said opening, whereby a tolerance is provided in the positioning of said die beneath said clip means.

6. The assembly defined in claim 5 wherein said clip means includes another arm having an opening therein with said openings being elongated in shape, said elongated openings in said arms positioned relative to each other and relative to first and second spherical electrodes on said die so that said arms may physically and electrically engage said first and second spherical electrodes at said elongated openings in said arms, said die adapted to be positioned at any one of a plurality of locations along the major axis of said elongated openings without said first and second spherical electrodes becoming disengaged from said arms of said clip means.

References Cited

UNITED STATES PATENTS

| | | | |
|---|---|---|---|
| 3,373,481 | 3/1968 | Lins et al. | 29—471.3 |
| 3,060,553 | 10/1962 | Kelley | 29—25.3 |
| 3,153,275 | 10/1964 | Ackerman | 29—25.3 |
| 3,275,904 | 9/1966 | Parker | 317—234 |
| 3,390,450 | 7/1968 | Checki et al. | 29—589 |

JOHN W. HUCKERT, Primary Examiner

R. F. POLISSACK, Assistant Examiner

U.S. Cl. X.R.

317—235